(12) United States Patent
Yosui et al.

(10) Patent No.: US 11,696,392 B2
(45) Date of Patent: Jul. 4, 2023

(54) TRANSMISSION LINE AND MOUNTING STRUCTURE THEREOF

(71) Applicant: Murata Manufacturing Co., Ltd., Nagaokakyo (JP)

(72) Inventors: Kuniaki Yosui, Nagaokakyo (JP); Keiichi Hirose, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 436 days.

(21) Appl. No.: 17/008,713

(22) Filed: Sep. 1, 2020

(65) Prior Publication Data

US 2020/0396826 A1 Dec. 17, 2020

Related U.S. Application Data

(63) Continuation of application No. PCT/JP2019/012102, filed on Mar. 22, 2019.

(30) Foreign Application Priority Data

Mar. 29, 2018 (JP) .................................. 2018-063459

(51) Int. Cl.
*H05K 1/02* (2006.01)
*H01P 3/08* (2006.01)

(52) U.S. Cl.
CPC ............... *H05K 1/025* (2013.01); *H01P 3/08* (2013.01)

(58) Field of Classification Search
CPC ................................. H05K 1/025; H01P 3/08
See application file for complete search history.

(56) References Cited

U.S. PATENT DOCUMENTS

| 2011/0217853 | A1 | 9/2011 | Comic et al. |
| 2017/0084974 | A1* | 3/2017 | Baba ....................... H01P 3/085 |
| 2017/0125870 | A1 | 5/2017 | Baba et al. |
| 2019/0141831 | A1 | 5/2019 | Baba |

FOREIGN PATENT DOCUMENTS

| JP | 2004-304401 A | 10/2004 |
| WO | 2016/088592 A1 | 6/2016 |
| WO | 2018/025697 A1 | 2/2018 |

OTHER PUBLICATIONS

Official Communication issued in International Patent Application No. PCT/JP2019/012102, dated Apr. 23, 2019.

* cited by examiner

*Primary Examiner* — Samuel S Outten
(74) *Attorney, Agent, or Firm* — Keating & Bennett, LLP

(57) ABSTRACT

A transmission line includes connecting portion connected to the outside and a main body connected to the connecting portion. The connecting portion includes a terminal electrode connected to an external electrode, a signal conductor, and a ground conductor. The main body includes the signal conductor and the ground conductor. The connecting portion includes a first region including the terminal electrode, a second region adjacent to the first region along a signal transmission path, and a third region located between the second region and the main body. Impedance matching at the at least one of the connecting portions is achieved by the first region, the second region, and the third region.

19 Claims, 16 Drawing Sheets

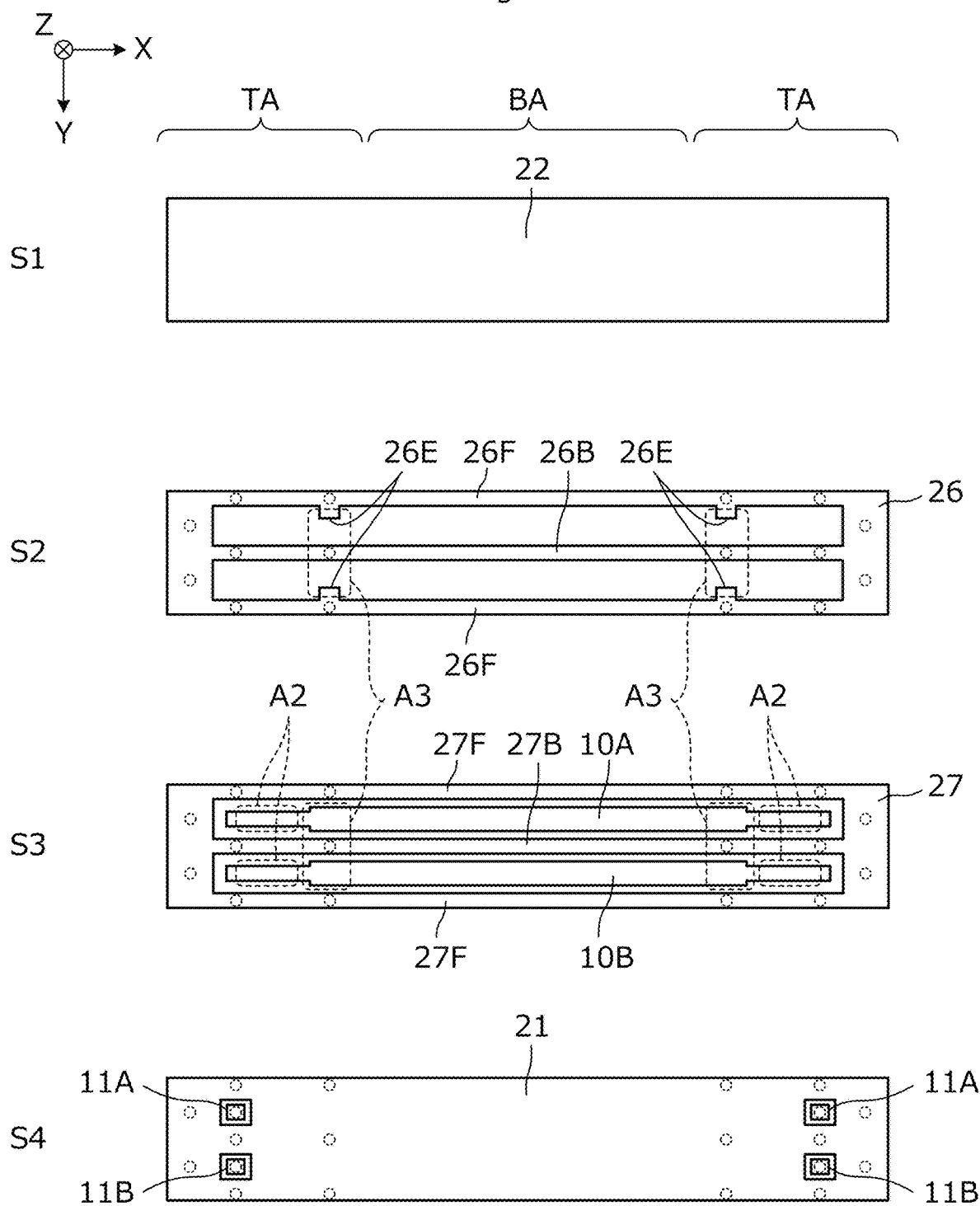

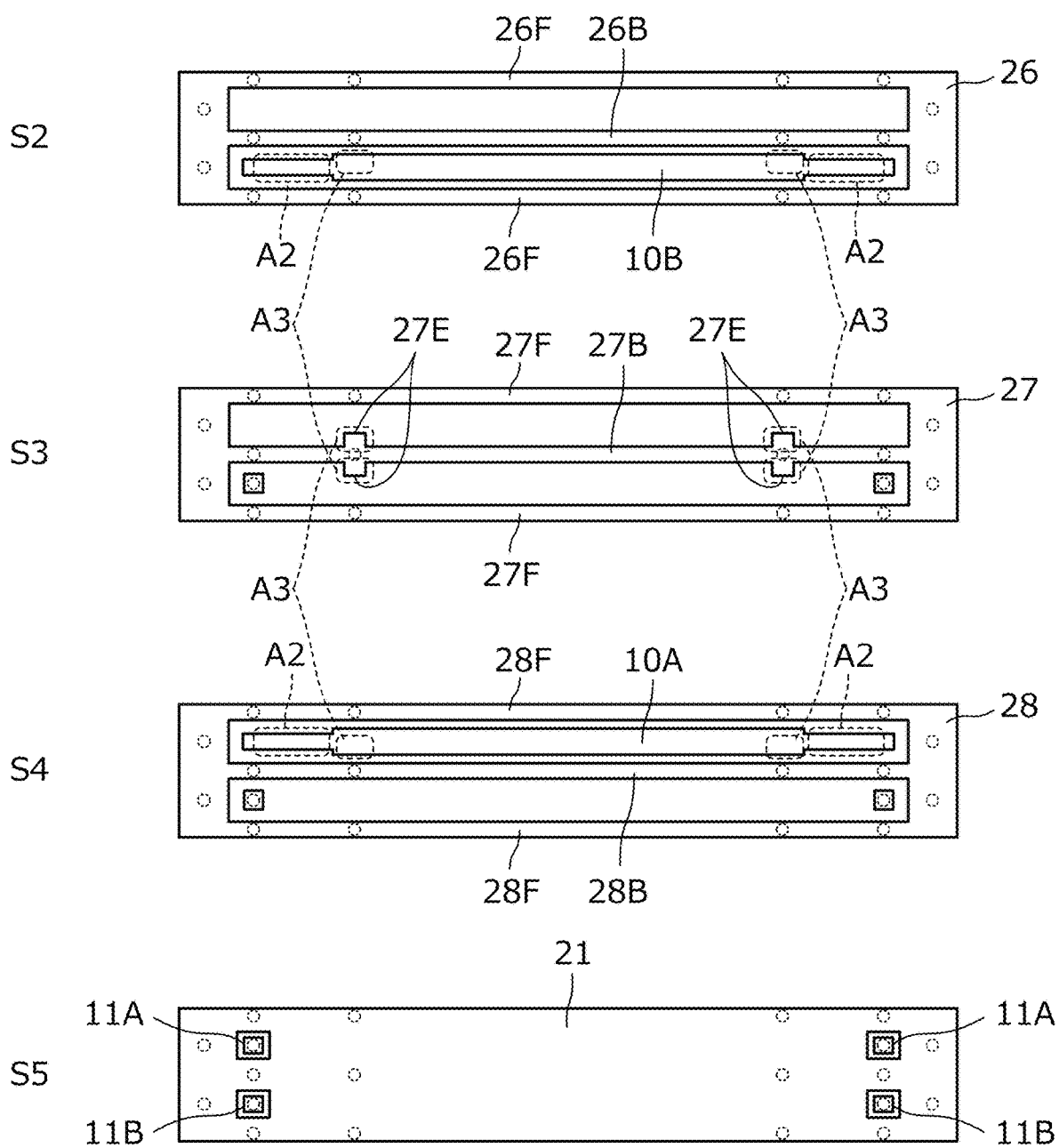

TRANSMISSION LINE AND MOUNTING STRUCTURE THEREOF

CROSS REFERENCE TO RELATED APPLICATIONS

This application claims the benefit of priority to Japanese Patent Application No. 2018-063459 filed on Mar. 29, 2018 and is a Continuation Application of PCT Application No. PCT/JP2019/012102 filed on Mar. 22, 2019. The entire contents of each application are hereby incorporated herein by reference.

BACKGROUND OF THE INVENTION

1. Field of the Invention

The present invention relates to a transmission line that transmits a signal and a mounting structure for mounting the transmission line on a circuit board or the like.

2. Description of the Related Art

A transmission line including a stacked body in which a plurality of insulating base materials are stacked has a structure in which an end of a signal conductor of the transmission line is connected to a terminal electrode formed on an upper surface or a lower surface of the stacked body. Therefore, in the transmission line including a plurality of signal conductors, because positions of the plurality of signal conductors in the stacking direction are different, lengths of interlayer connection conductors connected to the respective signal conductors are different, and this causes the electrical characteristics of the transmission line for each signal conductor to become uneven.

WO 2018/025697 A shows transmission lines in which unevenness of the electrical characteristics of each transmission line is suppressed by forming a conductor pattern for adjusting a path length of a signal conductor at an end of each signal conductor.

In the transmission lines in each of which the terminal electrode is pulled out from the end of the signal conductor of the transmission line as shown in WO 2018/025697 A, in a structural portion from the end of the signal conductor to the terminal electrode, parasitic components such as parasitic capacitance and parasitic inductance which are different from those in other structural portions (main transmission line parts) are generated. Therefore, impedance mismatching easily occurs in the structural portion from the end of the signal conductor to the terminal electrode. When the impedance mismatching as such occurs, insertion loss increases, and a problem occurs in a high frequency circuit due to signal reflection.

SUMMARY OF THE INVENTION

Preferred embodiments of the present invention provide transmission lines in each of which impedance matching is achieved in a structural portion from an end of a signal conductor to a terminal electrode, and also provide mounting structures of transmission lines.

A transmission line according to a preferred embodiment of the present invention includes a connecting portion connected to the outside and a main body connected to the connecting portion. The connecting portion includes a terminal electrode connected to an external electrode, a signal conductor, and a ground conductor, and at least one of the plurality of connecting portions includes a first region including the terminal electrode, a second region adjacent to the first region along a signal transmission path, and a third region located between the second region and the main body. The first region includes a capacitance component generated between the terminal electrode and the ground conductor larger than a capacitance component generated in the main body, the second region includes an inductance component generated in the signal conductor larger than an inductance component generated in the main body, and the third region includes a capacitance component generated between the signal conductor and the ground conductor larger than the capacitance component generated in the main body.

According to the above configuration, the capacitance component of the first region, the inductance component of the second region, and the capacitance component of the third region define a C-L-C circuit. Therefore, a shift in impedance due to the capacitance component generated in the first region is corrected by the inductance component in the second region and the capacitance component in the third region, and can be matched with the characteristic impedance of the main body of the transmission line. Therefore, increases in reflection and insertion loss due to impedance discontinuity are reduced or prevented.

In a preferred embodiment of the present invention, the transmission line further comprises a plurality of the connecting portions. All of the plurality of connecting portions include the first region, the second region, and the third region. According to this configuration, impedances are matched at all of the connecting portions, and the increases in reflection and insertion loss due to impedance discontinuity are further reduced or prevented.

In a preferred embodiment of the present invention, an end and the main body of the transmission line include an insulating base material and a conductor pattern that define a multilayer substrate. According to this configuration, the transmission line is able to be easily manufactured by a manufacturing method of the multilayer substrate.

In a preferred embodiment of the present invention, the terminal electrode includes a portion wider than a line width of the signal conductor of the main body. That is, the terminal electrode is an electrode including the portion wider than the line width of the signal conductor of the main body. According to this configuration, a connection structure between the terminal electrode and the signal conductor is able to be easily configured.

In a preferred embodiment of the present invention, the signal conductor in the second region includes a line width narrower than the line width of the signal conductor in the main body. According to this configuration, the second region is able to be easily provided only by defining a pattern of the signal conductor.

In a preferred embodiment of the present invention, the signal conductor and the ground conductor in the third region include a gap closer than a gap between the signal conductor and the ground conductor in the main body. According to this configuration, because the third region is provided without changing the line width of the signal conductor in the third region, that is, without providing an uneven portion or an edge portion in the conductor pattern, the loss that occurs in the uneven portion or the edge portion of the signal conductor pattern is able to be avoided.

In a preferred embodiment of the present invention, a connector is provided that is electrically connected to the terminal electrode and the ground conductor, respectively, and is connected to the external electrode. When the connector is provided as described above, the capacitance component generated between the ground conductor of the connector and the terminal electrode tends to increase. However, according to a preferred embodiment of the present invention, the second region and the third region can be predetermined so as to enable impedance matching by the C-L-C circuit structure.

In a preferred embodiment of the present invention, a plurality of the signal conductors and a plurality of the terminal electrodes are each provided. According to this configuration, in the transmission line including the plurality of signal conductors, impedance matching is able to be achieved at the connecting portion.

In a preferred embodiment of the present invention, a plurality of the signal conductors and a plurality of the terminal electrodes are each provided, and among the plurality of signal conductors, the signal conductors adjacent to each other are provided in different layers. With this configuration, it is possible to increase a gap between the adjacent signal conductors, and isolation of signals between the signal conductors is able to be easily ensured. Further, the ground conductor between the signal conductors improves the isolation between the signal conductors. In addition, the transmission line having a narrower width as a whole can be provided as compared with a structure in which signal conductors are adjacent to each other. According to this configuration, although the distance in the thickness direction of the stacked body from the terminal electrode to the signal conductor differs for each signal conductor, impedance matching is achieved for each connecting portion.

In a preferred embodiment of the present invention, in the third region, the ground conductor between the signal conductors adjacent to each other and each of the signal conductors adjacent to each other include a gap narrower than in the second region and the main body. According to this configuration, because the pattern of the signal conductor can be made constant in the third region and in the main body, the loss generated in the uneven portion and the edge portion of the signal conductor pattern can be avoided.

A mounting structure of a transmission line according to a preferred embodiment of the present invention includes a transmission line according to a preferred embodiment of the present invention, and a circuit board on which the transmission line is mounted, in which the terminal electrode of the transmission line is connected to an electrode provided on a surface of the circuit board. According to this configuration, the mounting structure of the transmission line can be obtained in which impedance matching is achieved at the connecting portion.

According to preferred embodiments of the present invention, it is possible to obtain transmission lines in each of which impedance matching is achieved at the connecting portion connected to the outside, and to obtain mounting structures of the transmission lines.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13 is a bottom view of each layer of a stacked body defining a transmission line according to a seventh preferred embodiment of the present invention.

FIG. 15 is a bottom view of each layer of a stacked body defining a transmission line according to an eighth preferred embodiment of the present invention.

DETAILED DESCRIPTION OF THE PREFERRED EMBODIMENTS

Figure 1A:
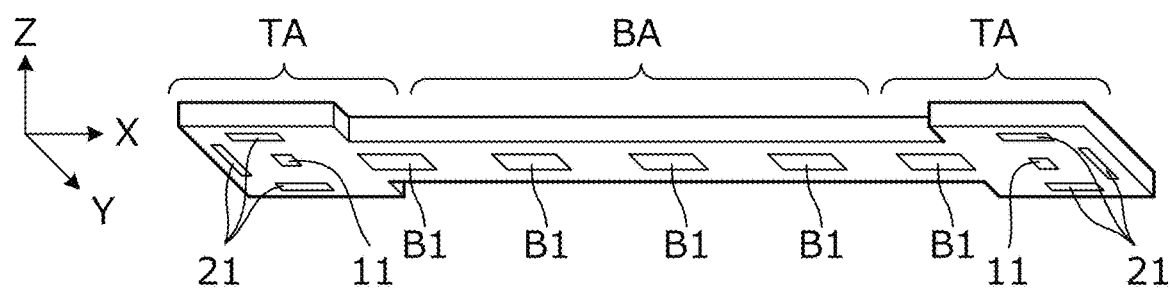
FIG. 1A is a perspective view of a transmission line 101 according to a first preferred embodiment of the present invention.

Hereinafter, preferred embodiments of the present invention are described with reference to the drawings and some specific examples. In the drawings, the same elements or portions are denoted by the same reference numerals. Although the preferred embodiments are shown separately for convenience in consideration of the explanation of main points or the ease of understanding, partial replacement or combination of the configurations shown in different preferred embodiments is possible. In the second and subsequent preferred embodiments, description of matters common to the first preferred embodiment is omitted, and only different points are described. In particular, the same operation and advantageous effects of the same or similar configuration is not successively described for each preferred embodiment.

First Preferred Embodiment

Figure 1B:
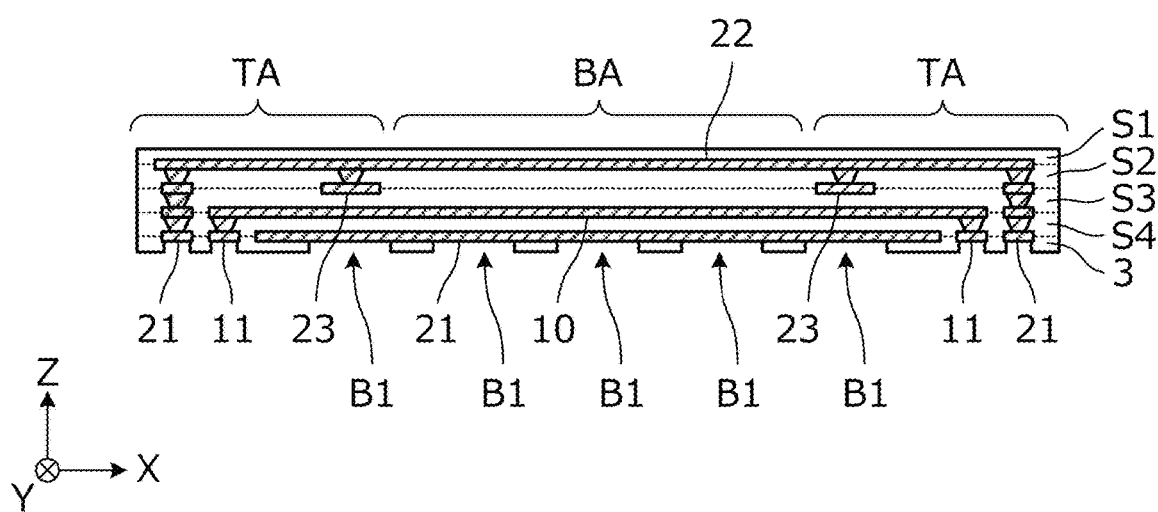
FIG. 1B is a cross-sectional view of the transmission line 101.

FIG. 1A is a perspective view of a transmission line 101 according to a first preferred embodiment of the present invention, and FIG. 1B is a cross-sectional view of the transmission line 101.

The transmission line 101 is a stacked body including insulating base materials S1 to S4 on which predetermined conductor patterns are provided and a cover film 3.

The transmission line 101 includes two connecting portions TA that are respectively connected to the outside and a main body BA located between the two connecting portions TA to TA. Each connecting portion TA includes a terminal electrode 11 connected to an external electrode described later, a signal conductor 10, and ground conductors 21 and 22. The main body BA includes the signal conductor 10 and the ground conductors 21 and 22. The cover film 3 includes openings B1 partially exposing the ground conductor 21.

Figure 2:
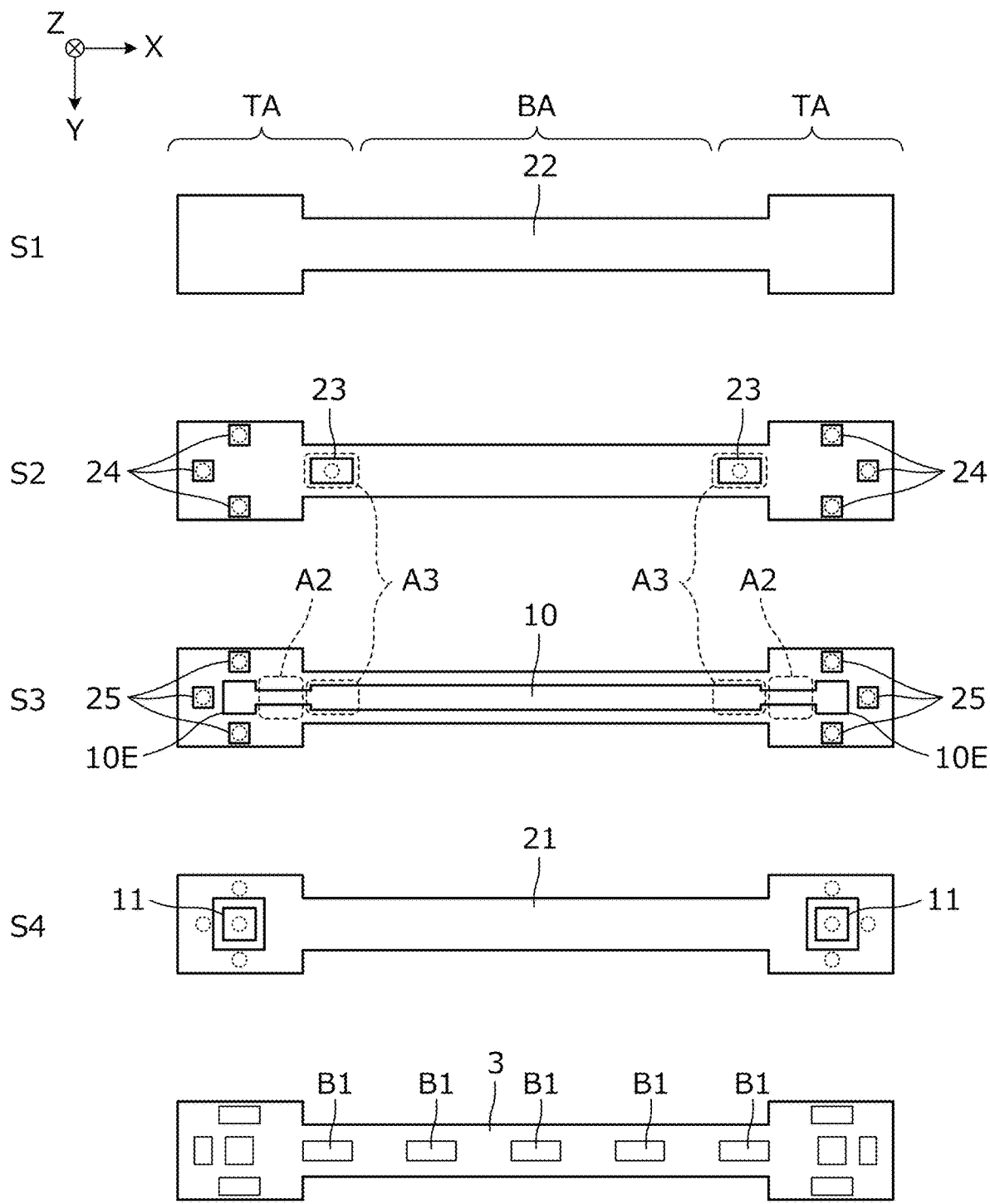
FIG. 2 is a bottom view of each layer of a stacked body defining the transmission line 101.
Figure 3:
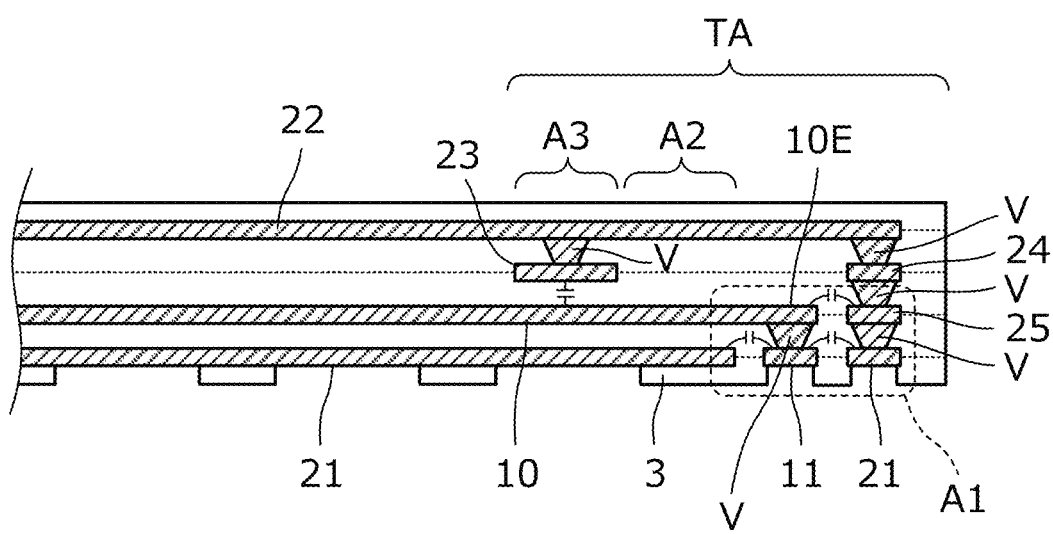
FIG. 3 is an enlarged cross-sectional view of a portion of a connecting portion TA of the transmission line 101.

FIG. 2 is a bottom view of each layer of the stacked body defining the transmission line 101. In a direction shown in FIGS. 1A and 1B, the insulating base materials S1 to S4 include predetermined conductor patterns provided on lower surfaces thereof. Further, FIG. 3 is an enlarged cross-sectional view of a portion of the connecting portion TA of the transmission line 101. In FIGS. 1B and 3, hatching at portions of insulator layers is omitted to clarify the diagrams. In each of the preferred embodiments described below, hatching of the portions of the insulator layers is omitted in the cross-sectional views.

The insulating base material S1 is provided on the entire or substantially the entire surface thereof with the ground conductor 22.

The insulating base material S2 includes electrodes 24 electrically connected to the ground conductor 22 via an interlayer connection conductor (via conductor) V, and ground conductors 23 each electrically connected to the ground conductor 22 via an interlayer connection conductor (via conductor) V.

The insulating base material S3 includes the signal conductor 10. Further, the insulating base material S3 includes electrodes 25 connected to the electrode 24 via an interlayer connection conductor (via conductor) V.

The insulating base material S4 includes the terminal electrodes 11 and the ground conductor 21. Each of the terminal electrodes 11 is connected to the end of the signal conductor 10 via an interlayer connection conductor (via conductor) V. The cover film 3 includes the openings B1 exposing the terminal electrodes 11 and predetermined portions of the ground conductor 21.

The insulating base materials S1 to S4 are flexible resin sheets such as, for example, liquid crystal polymer (LCP) and polyether ether ketone (PEEK). The electrodes (conductors) are each formed by sticking a copper foil on the insulating base material and patterning the copper foil by photolithography, for example. The cover film 3 is preferably, for example, a polyimide film. Note that a resist film may be formed by, for example, printing, instead of pasting the cover film as described above.

In the main body BA, a strip line includes the signal conductor 10 and the ground conductors 21 and 22, and the insulating base material between the ground conductors 21 and 22 and the signal conductor 10. Similarly, in the connecting portion TA, a strip line includes the signal conductor 10 and the ground conductors 21 and 22, and the insulating base material between the ground conductors 21 and 22 and the signal conductor 10.

As represented by symbols of capacitors in FIG. 3, capacitance components (parasitic capacitance) are generated between the terminal electrode 11 and the ground conductor 21, and between the terminal electrode 11 and the electrode 25 adjacent thereto. The region where the capacitance components are generated corresponds to a "first region" A1.

As shown in FIG. 2, portions of the signal conductor 10 connected to the terminal electrode 11 are narrower than a line width of the signal conductor 10 in the main body BA. An inductance component at the portions where the signal conductor 10 has the narrow line width is larger than the inductance component of the signal conductor 10 in the main body BA. The portions where the signal conductor 10 has the narrow line width each corresponds to a "second region" A2.

The ground conductors 23 are provided at a position facing a portion of the signal conductor 10 between the second region A2 and the main body BA. Each of the ground conductors 23 is electrically connected to the ground conductor 22 via an interlayer connection conductor V. The capacitance component is generated between the ground conductor 23 and the signal conductor 10. The region where the capacitance component is generated corresponds to a "third region" A3.

As described above, the connecting portion TA includes the first region A1 including the terminal electrode 11, the second region A2 adjacent to the first region A1 along the signal transmission path, and the third region A3 located between the second region A2 and the main body BA. In the first region A1, the capacitance component generated between the terminal electrode and the ground conductor 21 is larger than the capacitance component generated in the main body BA. Further, in the second region A2, the inductance component generated in the signal conductor 10 is larger than the inductance component generated in the main body BA. Furthermore, in the third region A3, the capacitance component generated between the signal conductor 10 and the ground conductor 21 is larger than the capacitance component generated in the main body BA.

Figure 4:
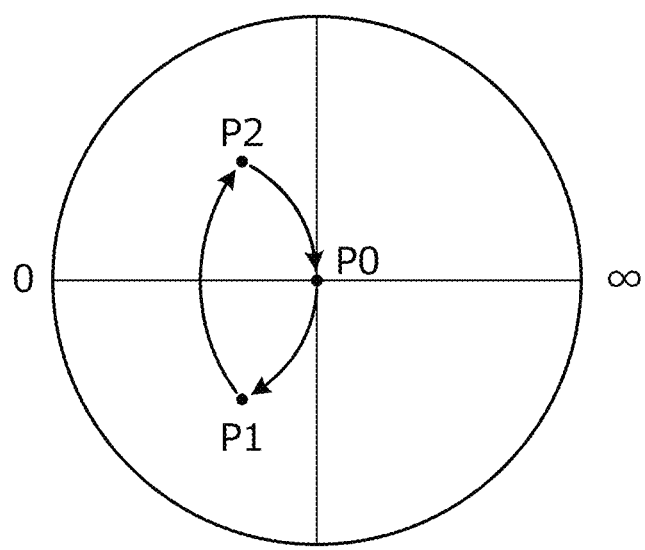
FIG. 4 is a Smith chart showing an action of a first region A1, a second region A2, and a third region A3 provided in the connecting portion TA.

FIG. 4 is a Smith chart showing the action of the first region A1, the second region A2, and the third region A3 provided in the connecting portion TA. In FIG. 4, each point represents the impedance in each portion of the transmission line 101, and each curve represents a process of change in impedance by the first region A1, the second region A2, and the third region A3 due to insertion of reactance.

Due to the influence of the capacitance component of the first region A1 shown in FIG. 3, the impedance seen from the front side of the first region A1 to the first region A1 side is displaced from a reference point P0 to P1 along a constant conductance circle. Further, due to the action of the inductance component of the second region A2, the impedance seen from the front side of the second region A2 to the second region A2 side is displaced to P2 along a constant resistance circle. Then, due to the action of the capacitance component of the third region A3, the impedance seen from the front side of the third region A3 to the third region A3 side is displaced to P0 along the constant conductance circle. In other words, the impedance matches with a reference impedance (50Ω)).

In the above description, in order to give priority to easy understanding, a lumped constant circuit is assumed to include the capacitance component and the inductance component as the main contributions. However, in reality, because the connecting portion TA is defined by a distributed constant circuit, small amounts of inductance and capacitance are present other than the main capacitance component and the main inductance component described above, and accordingly, the process of change in impedance is disturbed more than that in the example shown in FIG. 4.

Because the signal conductor 10 of the main body BA has a constant width, a change in the characteristic impedance of the main body BA is small and transmission loss is small.

In the example shown in FIG. 2, the signal conductor 10 has a step shape at a boundary between the portion with the narrow line width defining the second region and the main body BA (portion with broad line width). However, it is preferable that the boundary where the line width of the signal conductor 10 changes is tapered such that the line width changes gradually along the signal transmission direction. This is because the loss generated at the portion where the line width of the signal conductor 10 changes is reduced or prevented.

Second Preferred Embodiment

A second preferred embodiment of the present invention is an example of a mounting structure of a transmission line.

Figure 5A:
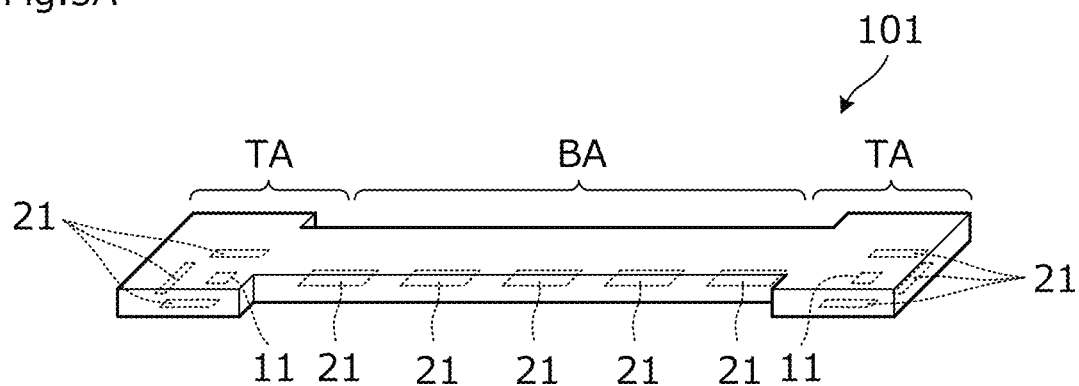
FIG. 5A is an exploded perspective view of a main portion of an electronic device 301 according to a second preferred embodiment of the present invention.
Figure 5B:
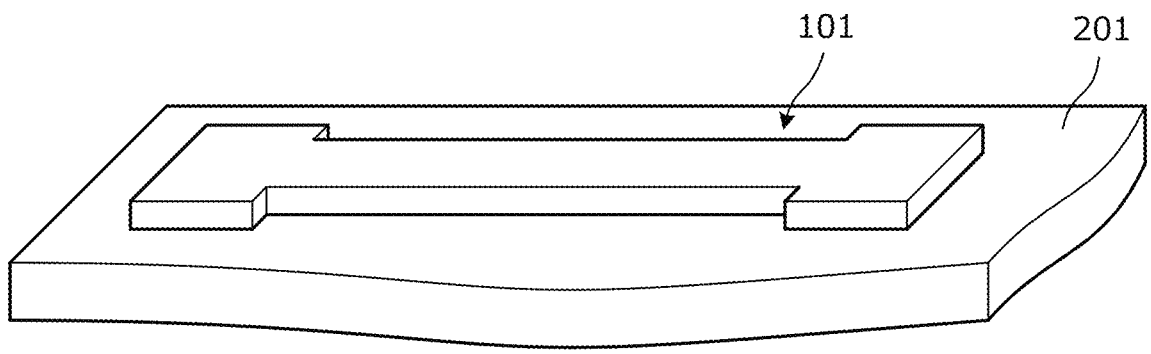
FIG. 5B is a perspective view of the main portion of the electronic device 301.

FIG. 5A is an exploded perspective view of a main portion of an electronic device 301 according to the second preferred embodiment, and FIG. 5B is a perspective view of the main portion of the electronic device 301.

As shown in FIG. 5B, the electronic device 301 of the present preferred embodiment includes a substrate 201 and the transmission line 101 mounted on the substrate 201. Although elements other than the transmission line 101 are also mounted on the substrate 201, the elements are not shown in FIGS. 5A and 5B.

The configuration of the transmission line 101 shown in FIGS. 5A and 5B is as shown in the first preferred embodiment.

The ground conductor 21 is exposed from the cover film 3 on the lower surface (mounting surface) of the transmission line 101.

The resist film is provided on the mounting surface of the substrate 201. The substrate 201 includes substrate-side connection electrodes 61 to which the terminal electrodes 11 of the transmission line 101 are connected and which are exposed from the resist film. Further, a substrate-side ground conductor 51 is exposed on the mounting surface of the substrate 201.

By surface-mounting the transmission line 101 on the substrate 201, the terminal electrodes 11 of the transmission line 101 are connected to the substrate-side connection electrodes 61, and the ground conductor 21 of the transmission line 101 is connected to the substrate-side ground conductor 51. These connections are made by soldering, for example.

Figure 6:
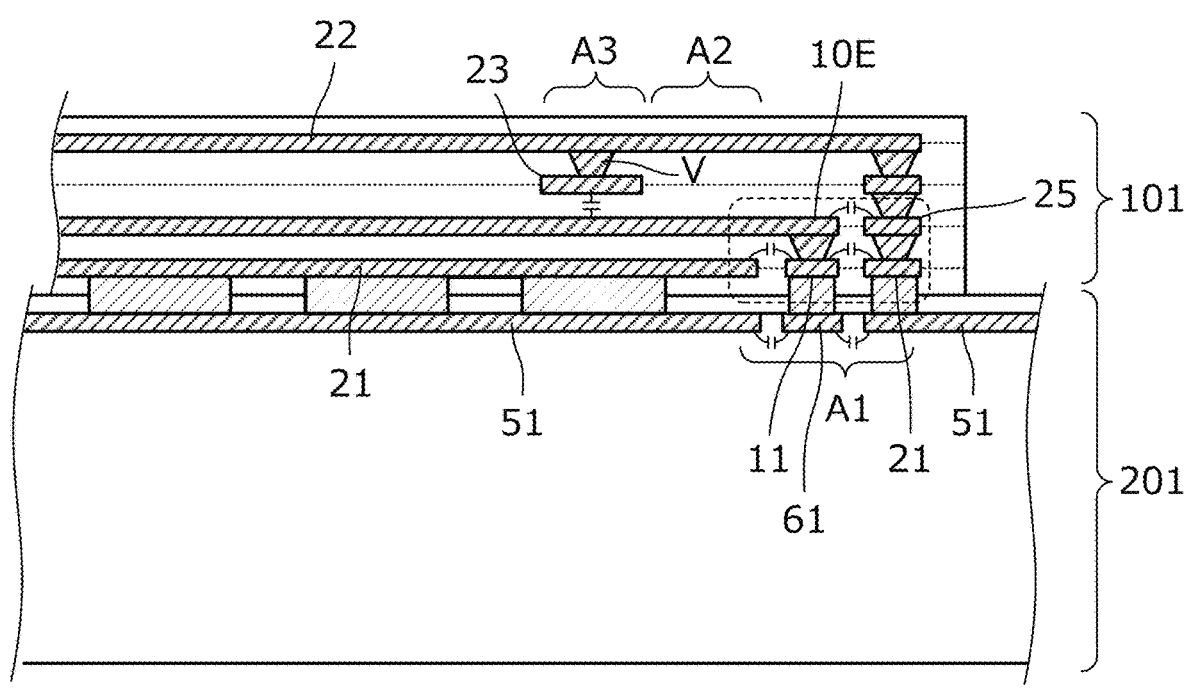
FIG. 6 is a partially enlarged cross-sectional view showing a state in which the transmission line 101 is mounted on a substrate 201.

FIG. 6 is a partially enlarged cross-sectional view in which the transmission line 101 is mounted on the substrate 201. As shown by the symbol of the capacitor in FIG. 6, the capacitance component (parasitic capacitance) is also generated between the substrate-side connection electrode 61 and the substrate-side ground conductor 51. The parasitic capacitance of the transmission line 101 alone is as shown in FIG. 3. That is, by mounting the transmission line 101 on the substrate 201, the capacitance component added to the first region A1 increases. An impedance matching circuit defined by the first region A1, the second region A2, and the third region A3 provided at the connecting portion of the transmission line 101 may be determined according to an increase in capacitance component added to the first region A1 in the mounted state on the substrate. As a result, the impedance matching of the connecting portion is performed with higher accuracy in a state in which the transmission line 101 is mounted on the substrate 201.

Third Preferred Embodiment

A third preferred embodiment of the present invention is an example of a transmission line with a connector, and a mounting structure thereof.

Figure 7:
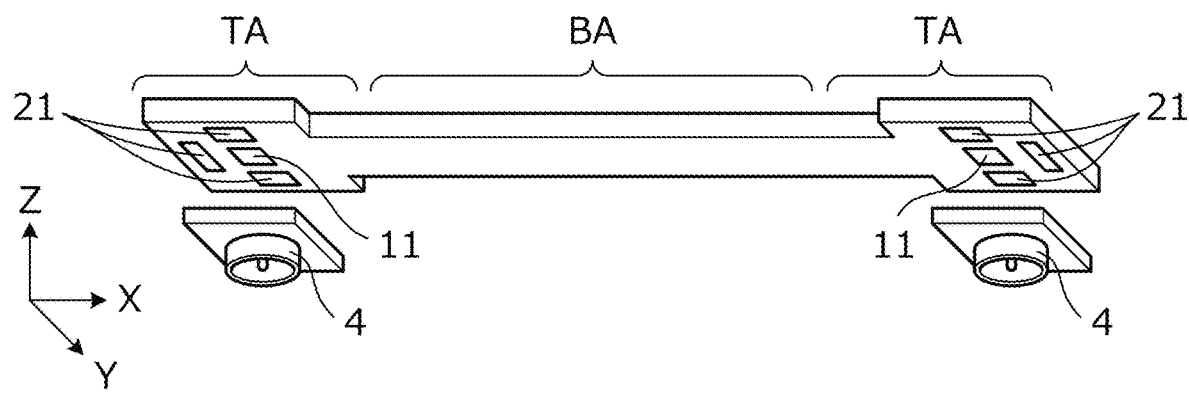
FIG. 7 is an exploded perspective view of a transmission line 103 according to a third preferred embodiment of the present invention.

FIG. 7 is an exploded perspective view of a transmission line 103 according to the third preferred embodiment. This transmission line 103 includes two coaxial connectors 4. A basic structure of the transmission line before the coaxial connectors 4 are attached is the same or substantially the same as that of the transmission line 101 shown in FIG. 1A. A center conductor of each of the coaxial connectors 4 is connected to the terminal electrode 11, and an outer conductor of each of the coaxial connectors 4 is connected to the ground conductor 21.

Accordingly, when the connector 4 is provided, the parasitic capacitance is generated between the outer conductor of the connector 4 and the terminal electrode 11, and this parasitic capacitance is added to the first region A1 of the transmission line. Even in this case, the impedance matching circuit defined by the first region A1, the second region A2, and the third region A3 (see FIG. 3) provided at the connecting portion of the transmission line 103 may be determined according to an increase in the capacitance component added to the first region A1 by attaching the connector 4. As a result, the impedance matching of the connecting portion can be performed with higher accuracy in the state in which the connector 4 is attached.

Figure 8A:
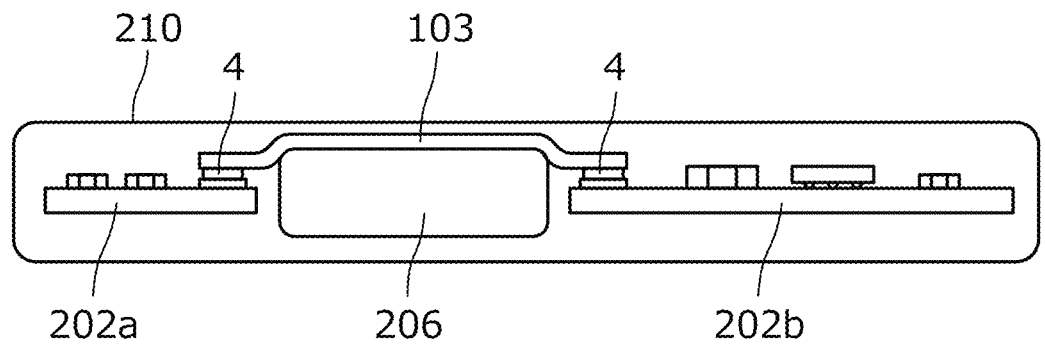
FIG. 8A is a cross-sectional view of a portable electronic device showing a mounted state of the transmission line 103 with connectors.
Figure 8B:
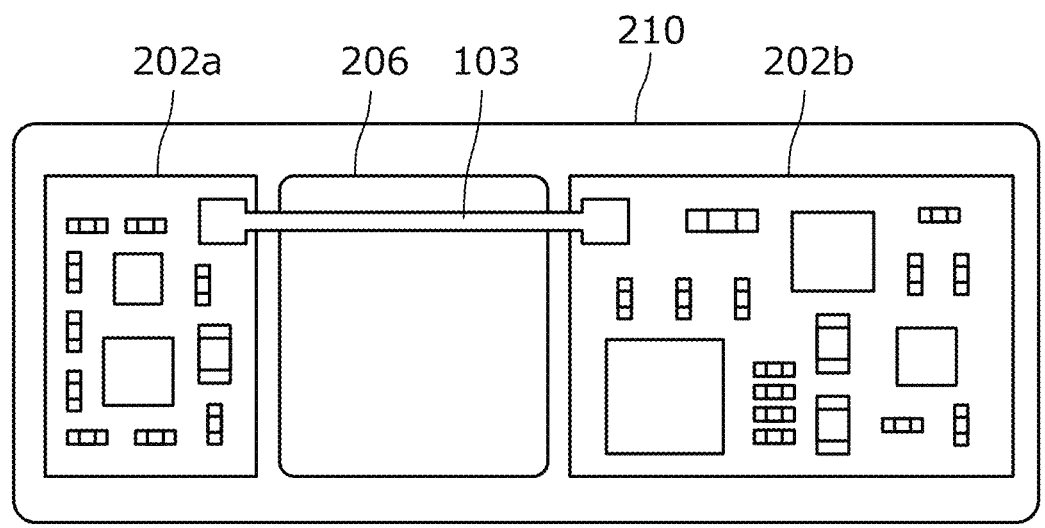
FIG. 8B is a plan view inside a housing of the portable electronic device.

FIG. 8A is a cross-sectional view of a portable electronic device showing a mounted state of the transmission line 103 with the connectors, and FIG. 8B is a plan view of the inside of a housing of the portable electronic device.

The portable electronic device 302 includes a thin housing 210. In the housing 210, circuit boards 202a and 202b, a battery pack 206, and the like are provided. On the surfaces of the circuit boards 202a and 202b, chip components are mounted. The circuit boards 202a and 202b and the battery pack 206 are installed in the housing 210 such that the battery pack 206 is between the circuit boards 202a and 202b in plan view of the housing 210. Because the housing 210 is as thin as possible, a gap between the battery pack 206 and the housing 210 in the thickness direction of the housing 210 is extremely narrow. Therefore, a normal coaxial cable cannot be disposed therebetween.

Because the transmission line 103 of the present preferred embodiment has flexibility, the transmission line can be bent along the gap. By arranging the transmission line 103 such that the thickness direction thereof matches the thickness direction of the housing 210, the transmission line 103 can be passed between the battery pack 206 and the housing 210. As a result, the circuit boards 202a and 202b that are spaced apart with the battery pack 206 disposed in the middle can be connected by the transmission line 103.

The transmission lines according to preferred embodiments of the present invention are each configured such that the portion of the impedance matching circuit is defined by the conductor patterns only, and therefore, the process can be simplified. Also, the resistance to bending stress is high. That is, unlike the case in which the chip components for impedance matching are mounted on the transmission line, a fault does not occur that the chip components are subjected to bending stress and falls off as the transmission line is bent.

Fourth Preferred Embodiment

A fourth preferred embodiment of the present invention is a transmission line having a structure of a third region different from that of the transmission line shown in the first preferred embodiment.

Figure 9:
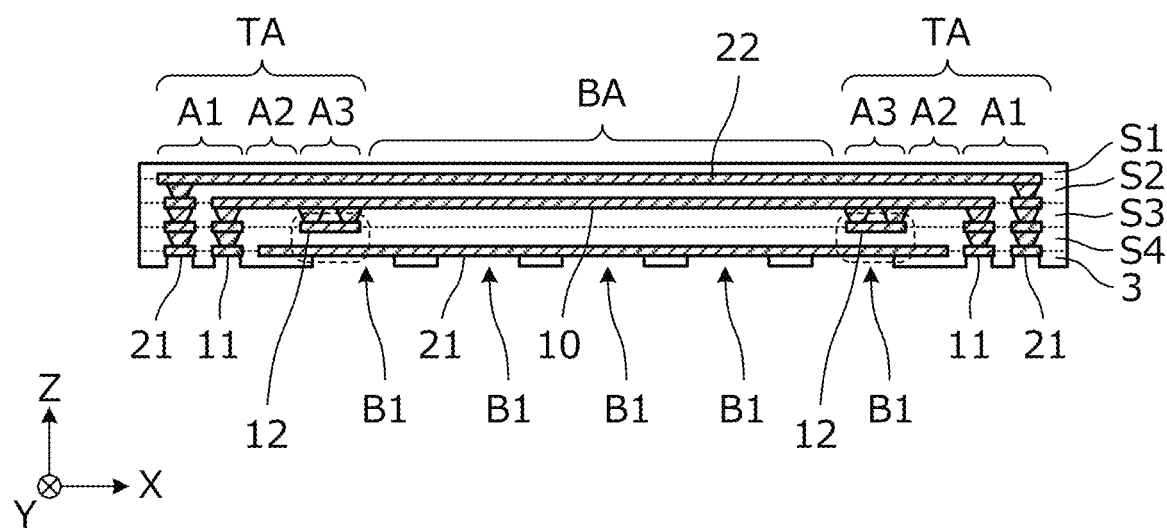
FIG. 9 is a cross-sectional view of a transmission line 104 according to a fourth preferred embodiment of the present invention.

FIG. 9 is a cross-sectional view of a transmission line 104 according to the fourth preferred embodiment. A structure of the third region A3 is different from that of the transmission line 101 shown in FIG. 1B. In the transmission line 104 of the present preferred embodiment, the insulating base material S1 includes the ground conductor 22 on the lower surface thereof, and the insulating base material S2 includes the signal conductor 10 on the lower surface thereof. Also, the insulating base material S3 includes signal conductor protrusions 12 on the lower surface thereof. Further, the insulating base material S3 includes interlayer connection conductors (via conductors) that electrically connect the signal conductor 10 and the signal conductor protrusions 12. The insulating base material S4 includes the terminal electrodes 11 and the ground conductor 21.

The capacitance component generated in regions between the signal conductor protrusions 12 and the ground conductor 21 facing each other and surrounded by broken lines are larger than the capacitance component generated in the main body BA. The regions where the capacitance component is large each correspond to the "third region" A3. Other configurations are the same as or similar to the configurations in the first preferred embodiment.

As described above, the capacitance component may be generated between the portions protruding from the signal conductor 10 side in the stacking direction and the ground conductor 21.

Fifth Preferred Embodiment

A fifth preferred embodiment of the present invention is a transmission line having a structure of a third region different from that of the transmission line shown in the first preferred embodiment.

Figure 10:
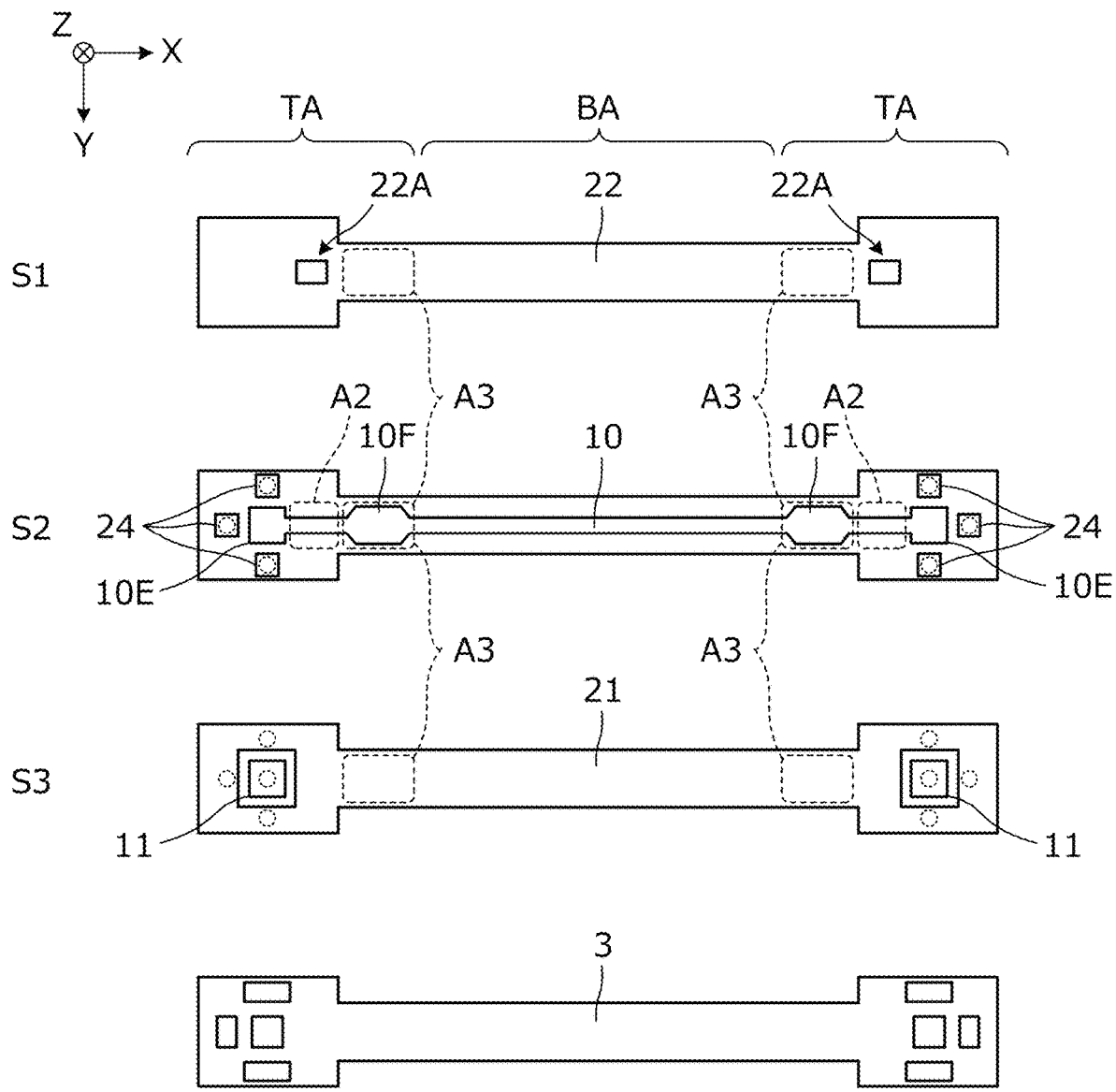
FIG. 10 is a bottom view of each layer of a stacked body defining a transmission line according to a fifth preferred embodiment of the present invention.

FIG. 10 is a bottom view of each layer of a stacked body defining the transmission line according to the fifth preferred embodiment. A predetermined conductor pattern is provided on the lower surface of each of the insulating base materials S1 to S3.

As shown in FIG. 10, the insulating base material S1 includes the ground conductor 22. Also on this insulating base material S1, ground conductor non-formed portions 22A are provided. The insulating base material S2 includes the electrodes 24 electrically connected to the ground conductor 22 via an interlayer connection conductor (via conductor), and the signal conductor 10. The insulating base material S3 includes the terminal electrodes 11 each connected to an end 10E of the signal conductor 10, and the ground conductor 21 connected to the electrodes 24 via an interlayer connection conductor (via conductor). The cover film includes the openings exposing predetermined portions of the terminal electrodes 11 and the ground conductor 21.

The capacitance component is small in facing portions of the signal conductor 10 and the ground conductor non-formed portions 22A. Therefore, the inductance component in these portions is larger than the capacitance component generated in the main body BA. The facing portions between the signal conductor 10 and the ground conductor non-formed portions 22A each correspond to the "second region" A2.

The capacitance component of the facing portion between broad portions 10F of the signal conductor 10 and the ground conductors 21 and 22 is larger than the capacitance component generated in the main body BA. The region where the capacitance component is large corresponds to the "third region" A3.

According to the present preferred embodiment, the third region can be easily configured with a small number of insulating base material layers.

Sixth Preferred Embodiment

A sixth preferred embodiment of the present invention is an example of a transmission line in which a line width of a signal conductor changes little.

Figure 11:
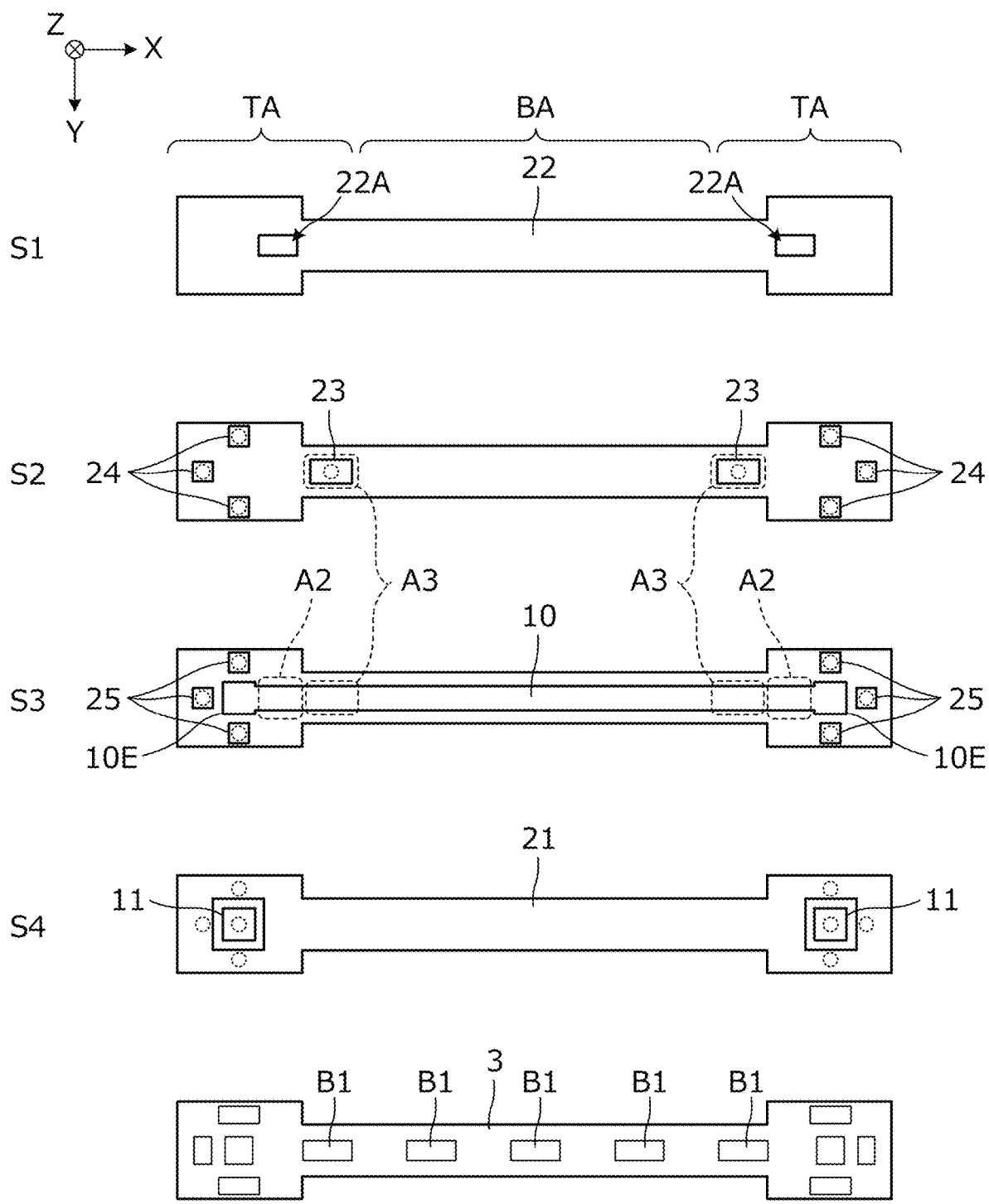
FIG. 11 is a bottom view of each layer of a stacked body defining a transmission line according to a sixth preferred embodiment of the present invention.
Figure 12:
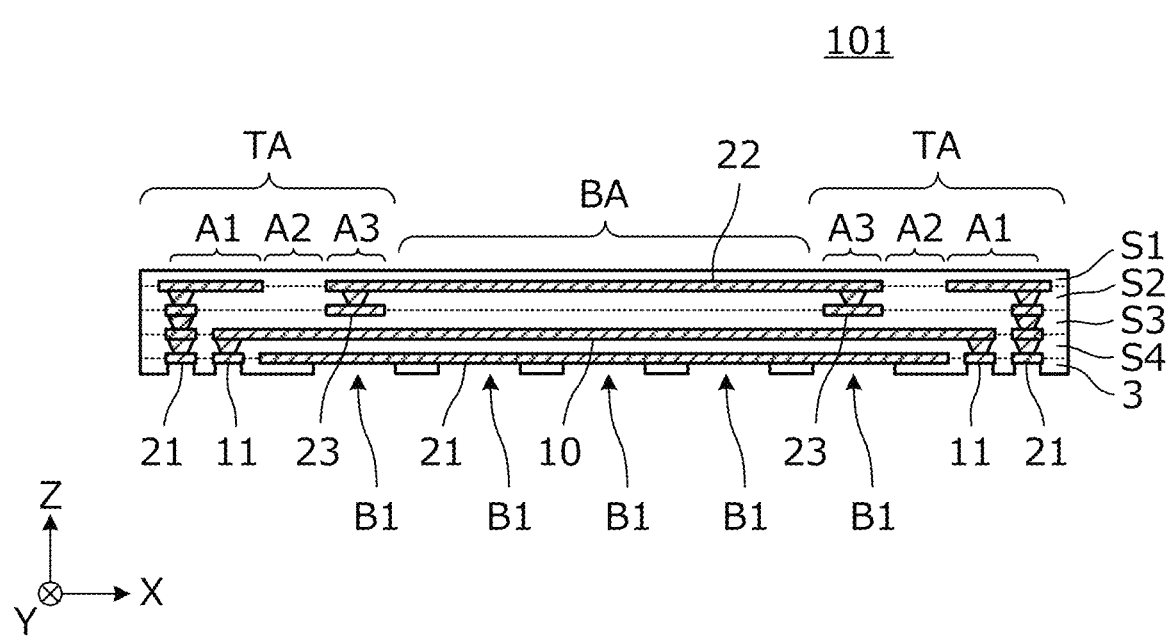
FIG. 12 is a cross-sectional view of the transmission line according to the sixth preferred embodiment of the present invention at a position along a signal conductor.

FIG. 11 is a bottom view of each layer of a stacked body defining the transmission line according to the sixth preferred embodiment. FIG. 12 is a cross-sectional view of the transmission line according to the sixth preferred embodiment at a position along a signal conductor.

As shown in FIG. 11, the insulating base material S1 includes the ground conductor 22. Also, this insulating base material S1 includes the ground conductor non-formed portions 22A. The insulating base material S2 includes the electrodes 24 electrically connected to the ground conductors 22 via an interlayer connection conductor (via conductor), and the ground conductors 23 electrically connected to the ground conductor 22 via interlayer connection conductors (via conductors). The insulating base material S3 includes the electrodes 25 connected to the electrodes 24 via an interlayer connection conductor (via conductor), and the signal conductor 10. The insulating base material S4 includes the terminal electrodes 11 each connected to the end 10E of the signal conductor 10 via an interlayer connection conductor (via conductor), and the ground conductor 21. The cover film 3 includes the openings B1 for exposing predetermined portions of the terminal electrodes 11 and the ground conductor 21.

The capacitance component is small in the facing portions of the signal conductor 10 and the ground conductor non-formed portions 22A. Therefore, the inductance component in these portions is larger than the capacitance component generated in the main body BA. The facing portions between the signal conductor 10 and the ground conductor non-formed portions 22A each correspond to the "second region" A2.

Further, the capacitance component is generated between the ground conductors 23 and the signal conductor 10. The region where the capacitance component is generated corresponds to the "third region" A3.

A configuration of the first region A1 shown in FIG. 12 is the same or substantially the same as the configuration of the first region A1 shown in the first preferred embodiment.

According to the present preferred embodiment, the line width of the signal conductor 10 is constant except for the ends 10E thereof, and therefore, there is no loss occurring at the portions where the line width changes, and the transmission loss of the entire line is small.

Seventh Preferred Embodiment

A seventh preferred embodiment of the present invention is an example of a transmission line including a plurality of signal conductors.

Figure 14A:
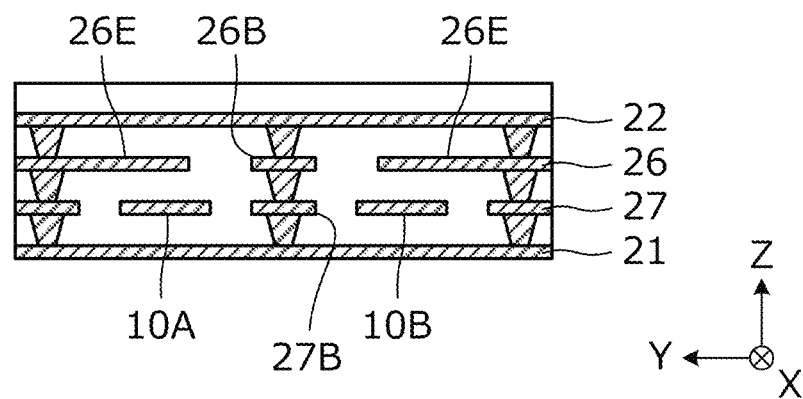
FIG. 14A is a cross-sectional view of the transmission line according to the seventh preferred embodiment of the present invention at a position passing through protrusions 26E of a ground conductor.
Figure 14B:
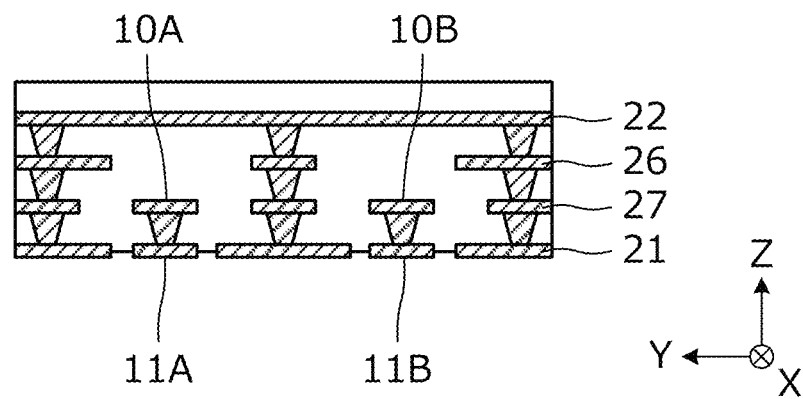
FIG. 14B is a cross-sectional view of the transmission line according to the seventh preferred embodiment of the present invention at a position passing through terminal electrodes 11A and 11B.

FIG. 13 is a bottom view of each layer of a stacked body defining the transmission line according to the seventh preferred embodiment. FIG. 14A is a cross-sectional view of the transmission line according to the present preferred embodiment at a position passing through protrusions 26E of a ground conductor described later. FIG. 14B is a cross-sectional view of the transmission line according to the present preferred embodiment at a position passing through terminal electrodes 11A and 11B described later.

Predetermined conductor patterns are provided on the lower surfaces of the insulating base materials S1 to S4.

The insulating base material S1 is provided on the entire or substantially the entire surface thereof with the ground conductor 22.

The insulating base material S2 includes a ground conductor 26. The ground conductor 26 includes a frame portion 26F along the outer periphery, a bar portion 26B passing through the center or approximate center, and the protrusions 26E protruding from the frame portion 26F toward the bar portion 26B. The ground conductor 26 is electrically connected to the ground conductor 22 via a plurality of interlayer connection conductors (via conductors).

The insulating base material S3 includes a ground conductor 27. The ground conductor 27 includes a frame portion 27F along the outer periphery and a bar portion 27B passing through the center. Further, on this insulating base material S3, signal conductors 10A and 10B are provided in regions surrounded by the frame portion 27F and the bar portion 27B. The ground conductor is electrically connected to the ground conductor 26 via a plurality of interlayer connection conductors.

The insulating base material S4 includes the terminal electrodes 11A and 11B and the ground conductor 21. The terminal electrodes 11A and 11B are connected to the signal conductors 10A and 10B via interlayer connection conductors. Further, the ground conductor 21 is electrically connected to the ground conductor 27 via a plurality of interlayer connection conductors.

By surrounding the signal conductors 10A and 10B by the ground conductors 21, 22, 26F, 26B, 27F, and 27B, two strip lines which are laterally closed by the ground conductors are provided.

As shown in FIG. 13, the portions of the signal conductors 10A and 10B connected to the terminal electrodes 11A and 11B are narrower than the line widths of the signal conductors 10A and 10B of the main body BA. The inductance component of the portions with the narrow line widths of the signal conductors 10A and 10B is larger than the inductance component of the signal conductors 10A and 10B in the main body BA. The portions with the narrow line width of the signal conductors 10A and 10B each corresponds to the "second region" A2.

A portion of the signal conductors 10A and 10B faces the protrusions 26E of the ground conductor in the stacking direction. The capacitance component is generated at the portions where the protrusions 26E of the ground conductor and the signal conductors 10A and 10B face each other. The region where the capacitance component is generated corresponds to the "third region" A3.

The protrusions 26E of the ground conductor may be provided on the bar portion 26B. Further, a shape may be used in which the frame portion 26F and the bar portion 26B are connected.

In the present preferred embodiment, an example of a transmission line including two signal conductors has been shown. However, similarly, the bar portions 26B and 27B may be provided in a plurality of pieces, and the signal conductors may be provided in three or more pieces.

According to the present preferred embodiment, the third region can be easily configured with a small number of insulating base material layers.

Eighth Preferred Embodiment

An eighth preferred embodiment of the present invention is an example of a transmission line including a plurality of signal conductors provided in different layers.

Figure 16:
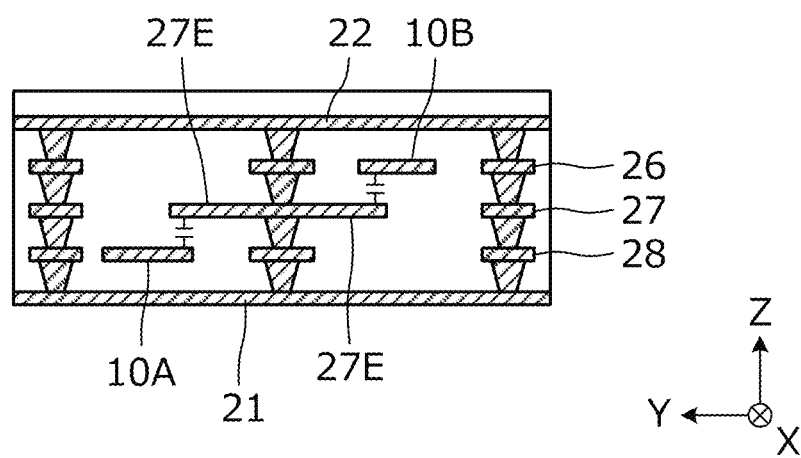
FIG. 16 is a cross-sectional view of the transmission line according to the eighth preferred embodiment of the present invention at a position passing through protrusions 27E of a ground conductor.

FIG. 15 is a bottom view of each layer of a stacked body defining the transmission line according to the eighth preferred embodiment. FIG. 16 is a cross-sectional view of the transmission line according to the present preferred embodiment at a position passing through protrusions 27E of a ground conductor described later.

Predetermined conductor patterns are provided on the lower surfaces of insulating base materials S1 to S5.

The insulating base material S1 is provided on the entire or substantially the entire surface thereof with the ground conductor 22.

The insulating base material S2 includes the ground conductor 26. The ground conductor 26 includes the frame portion 26F along the outer periphery and the bar portion 26B passing through the center or approximate center. Further, the insulating base material S2 includes the signal conductor 10B in one of regions surrounded by the frame portion 26F and the bar portion 26B. The ground conductor 26 is electrically connected to the ground conductor 22 via a plurality of interlayer connection conductors (via conductors).

The insulating base material S3 includes the ground conductor 27. The ground conductor 27 includes a frame portion 27F along the outer periphery, the bar portion 27B passing through the center or approximate center, and the protrusions 27E projecting from the bar portion 27B in the direction of the frame part 27F.

The insulating base material S4 includes a ground conductor 28. The ground conductor 28 includes a frame portion 28F along the outer periphery and a bar portion 28B passing through the center. Further, the insulating base material S4 includes the signal conductor 10A in one of regions surrounded by the frame portion 28F and the bar portion 28B. The ground conductor 28 is electrically connected to the ground conductor 27 via a plurality of interlayer connection conductors (via conductors).

An insulating base material S5 is formed with the terminal electrodes 11A and 11B and the ground conductor 21. The terminal electrodes 11A and 11B are connected to the signal conductors 10A and 10B via interlayer connection conductors. Further, the ground conductor 21 is electrically connected to the ground conductor 28 via a plurality of interlayer connection conductors.

By surrounding the signal conductors 10A and 10B by the ground conductors 21, 22, 26F, 26B, 27F, 27B, 28F, and 28B, two strip lines laterally closed by the ground conductors are provided.

As shown in FIG. 15, portions of the signal conductors 10A and 10B connected to the terminal electrodes 11A and 11B are narrower than the line width of the signal conductors 10A and 10B of the main body BA. The inductance component of the portions with the narrow line width of the signal conductors 10A and 10B is larger than the inductance component of the signal conductors 10A and 10B in the main body BA. The portions with the narrow line width of the signal conductors 10A and 10B each correspond to the "second region" A2.

A portion of the signal conductors 10A and 10B faces the protrusions 27E of the ground conductor in the stacking direction. The capacitance component is generated at portions where the protrusions 27E of the ground conductor and the signal conductors 10A and 10B face each other. The region where the capacitance component is generated corresponds to the "third region" A3.

The protrusions 27E of the ground conductor may have a shape that is coupled to the frame portion 27F.

According to the present preferred embodiment, the gap between the adjacent signal conductors 10A to 10B can be made large, and accordingly, the isolation of signals between the signal conductors 10A to 10B can be ensured. In addition, the bar portion 27B of the ground conductor between the signal conductors 10A to 10B improves the isolation between the signal conductors 10A to 10B. In addition, a transmission line can be configured having a narrower width than that of a structure in which signal conductors are adjacent to each other. According to this configuration, although the distance from the terminal electrodes 11A and 11B to the signal conductors 10A and 10B in the thickness direction of the stacked body is different for each signal conductor, the magnitude of the inductance component of the second region A2 and the magnitude of the capacitance component of the third region A3 may be determined so as to enable appropriate impedance matching to be performed for each connecting portion.

The description of the above preferred embodiments is illustrative in all aspects and is not restrictive. Modifications and changes can be made by those skilled in the art as appropriate.

For example, the connecting portions are not limited to one pair, and may be a plurality of pairs. Moreover, the preferred embodiments can be similarly applied to a structure in which a signal conductor is branched between a plurality of connecting portions and one connecting portion.

Further, for example, only one or some of the plurality of connecting portions TA may have the structure of the connecting portion TA of the transmission line shown in each preferred embodiment.

Further, the inductance component may be increased by configuring the signal conductor 10 in the second region A2 in a detour pattern such as a meander line shape, for example. In the second region A2, the inductance component may be increased by providing the ground conductor non-formed portion (conductor opening) in the ground conductor facing the signal conductor 10.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a connecting portion connected to an outside; and
a main body connected to the connecting portion; wherein
the connecting portion includes a terminal electrode connected to an external electrode, a signal conductor, and a ground conductor;
the main body includes a signal conductor and a ground conductor;
the connecting portion includes a first region including the terminal electrode, a second region adjacent to the first region along a signal transmission path, and a third region between the second region and the main body;
the first region has a capacitance component generated between the terminal electrode and the ground conductor larger than a capacitance component generated in the main body;
the second region has an inductance component generated in the signal conductor larger than an inductance component generated in the main body;
the third region has a capacitance component generated between the signal conductor and the ground conductor larger than the capacitance component generated in the main body;
the signal conductor and the ground conductor in the third region include a gap closer than a gap between the signal conductor and the ground conductor in the main body; and
the ground conductor in the third region includes a first ground conductor and a second ground conductor, and the second ground conductor is located between the signal conductor and the first ground conductor.

2. A mounting structure of a transmission line comprising:
the transmission line according to claim 1; and
a circuit board on which the transmission line is mounted; wherein
the terminal electrode of the transmission line is connected to an electrode provided on a surface of the circuit board.

3. The mounting structure of a transmission line according to claim 2, the transmission line further comprising a plurality of the connecting portions; wherein
the plurality of connecting portions and the main body include an insulating base material and a conductor pattern that define a multilayer substrate.

4. The mounting structure of a transmission line according to claim 3, wherein
a plurality of the signal conductors and a plurality of the terminal electrodes are each provided; and
among the plurality of signal conductors, signal conductors adjacent to each other are provided in different layers.

5. The mounting structure of a transmission line according to claim 4, wherein, in the third region, the ground conductor is provided between signal conductors of the plurality of signal conductors adjacent to each other and each of the signal conductors adjacent to each other include a gap narrower than in the second region and the main body.

6. The mounting structure of a transmission line according to claim 2, the transmission line further comprising a plurality of the connecting portions; wherein
all of the plurality of connecting portions include the first region, the second region, and the third region.

7. The mounting structure of a transmission line according to claim 2, wherein the terminal electrode includes a portion wider than a line width of the signal conductor of the main body.

8. The mounting structure of a transmission line according to claim 2, wherein the signal conductor in the second region has a line width narrower than a line width of the signal conductor in the main body.

9. The mounting structure of a transmission line according to claim 2, wherein the signal conductor and the ground conductor in the third region include a gap closer than a gap between the signal conductor and the ground conductor in the main body.

10. The mounting structure of a transmission line according to claim 2, further comprising a connector that is electrically conducted to the terminal electrode and the ground conductor, respectively, and is connected to the external electrode.

11. The mounting structure of a transmission line according to claim 2, wherein a plurality of the signal conductors and a plurality of the terminal electrodes are each provided.

12. The transmission line according to claim 1, wherein the connecting portion and the main body include an insulating base material and a conductor pattern that define a multilayer substrate.

13. The transmission line according to claim 12, wherein
a plurality of the signal conductors and a plurality of the terminal electrodes are each provided; and
among the plurality of signal conductors, signal conductors adjacent to each other are provided in different layers.

14. The transmission line according to claim 13, wherein, in the third region, the ground conductor is provided between signal conductors of the plurality of signal conductors adjacent to each other and each of the signal conductors adjacent to each other include a gap narrower than in the second region and the main body.

15. The transmission line according to claim 1, further comprising a plurality of the connecting portions; wherein
all of the plurality of connecting portions include the first region, the second region, and the third region.

16. The transmission line according to claim 1, wherein the terminal electrode includes a portion wider than a line width of the signal conductor of the main body.

17. The transmission line according to claim 1, wherein the signal conductor in the second region has a line width narrower than a line width of the signal conductor in the main body.

18. The transmission line according to claim 1, further comprising a connector that is electrically conducted to the terminal electrode and the ground conductor, respectively, and is connected to the external electrode.

19. The transmission line according to claim 1, wherein a plurality of the signal conductors and a plurality of the terminal electrodes are each provided.

* * * * *